(12) United States Patent
Robertson

(10) Patent No.: US 7,092,252 B2
(45) Date of Patent: Aug. 15, 2006

(54) AIR-DIRECTING UNIT

(75) Inventor: Kenneth G. Robertson, San Jose, CA (US)

(73) Assignee: Hewlett-Packard Development, L.P., Houston, TX (US)

( * ) Notice: Subject to any disclaimer, the term of this patent is extended or adjusted under 35 U.S.C. 154(b) by 242 days.

(21) Appl. No.: 10/419,032

(22) Filed: Apr. 17, 2003

(65) Prior Publication Data
US 2004/0207982 A1    Oct. 21, 2004

(51) Int. Cl.
 *H05K 7/20* (2006.01)
(52) U.S. Cl. .................. 361/690; 361/694; 361/715; 439/135; 439/139; 454/184
(58) Field of Classification Search .............. 165/80.3; 361/687–695, 715; 439/135, 149, 940; 454/184
See application file for complete search history.

(56) References Cited

U.S. PATENT DOCUMENTS

| | | | | |
|---|---|---|---|---|
| 4,795,354 A | * | 1/1989 | Owen | 439/137 |
| 6,193,529 B1 | * | 2/2001 | Kimura | 439/149 |
| 6,315,584 B1 | * | 11/2001 | Greenside et al. | 439/135 |
| 6,755,672 B1 | * | 6/2004 | Lai et al. | 439/135 |

* cited by examiner

*Primary Examiner*—Gregory D Thompson

(57) ABSTRACT

An air-directing unit for use in redirecting air flow in a memory module environment of a computer. The air-directing unit comprises a body portion configured to redirect air flow therearound such that the air flow is redirected in the memory module environment. The air-directing unit includes a coupling element for removably engaging the air-directing unit with a connector portion of the memory module environment, the coupling element removably engaging the air-directing unit without compromising electrical contacts in the connector.

36 Claims, 3 Drawing Sheets

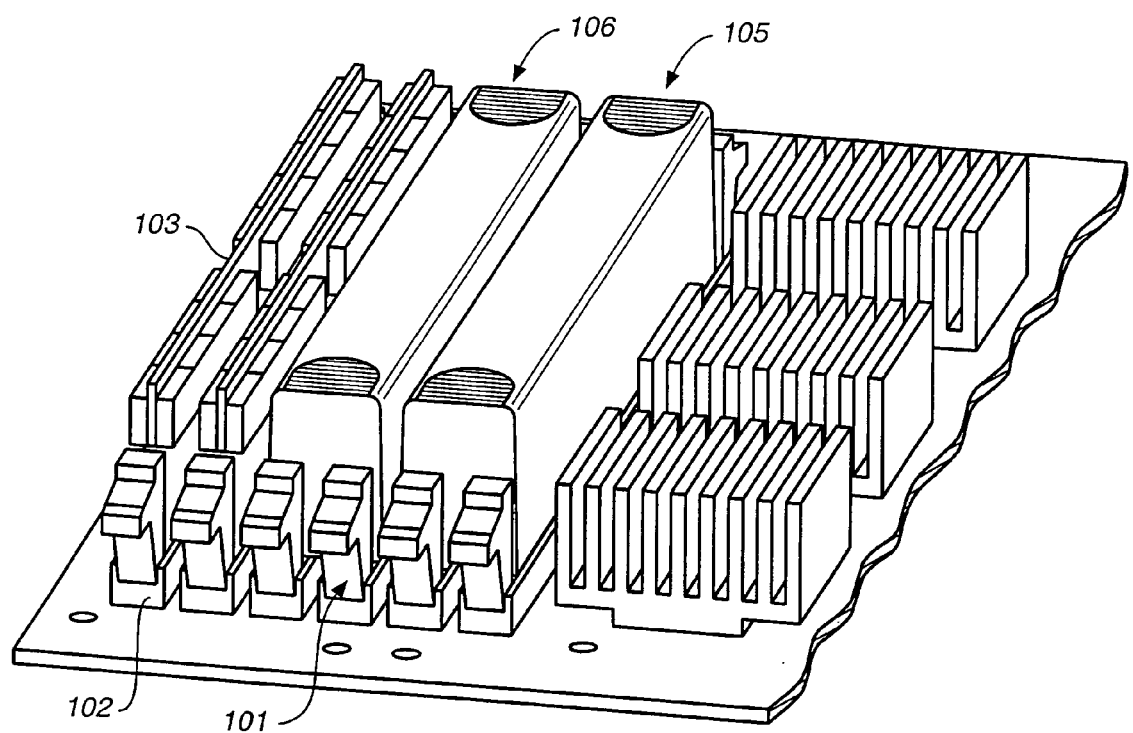
FIG._1

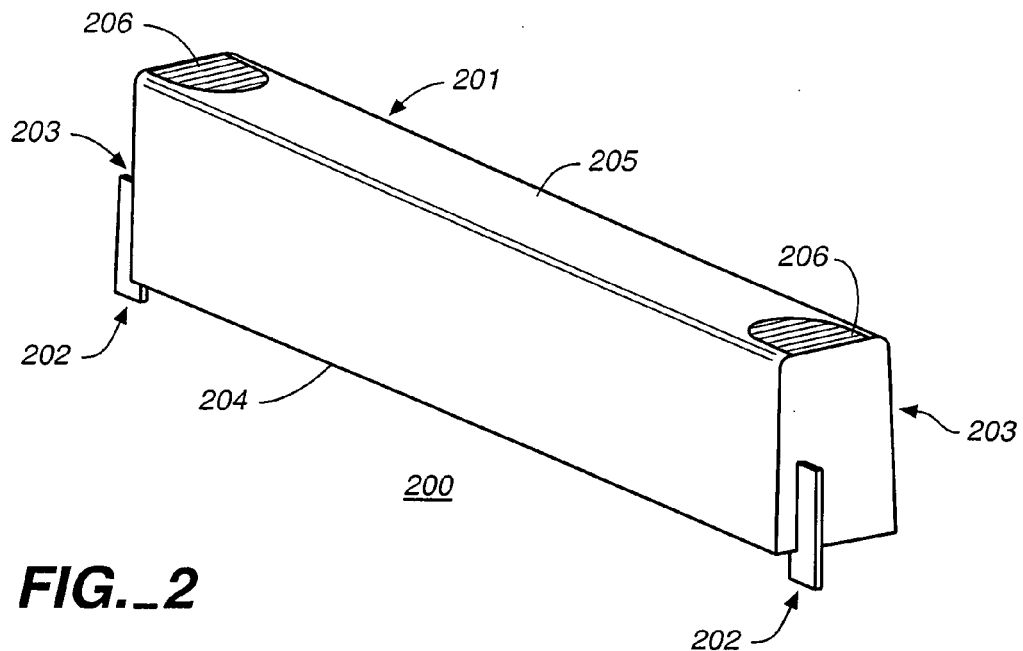
FIG._2
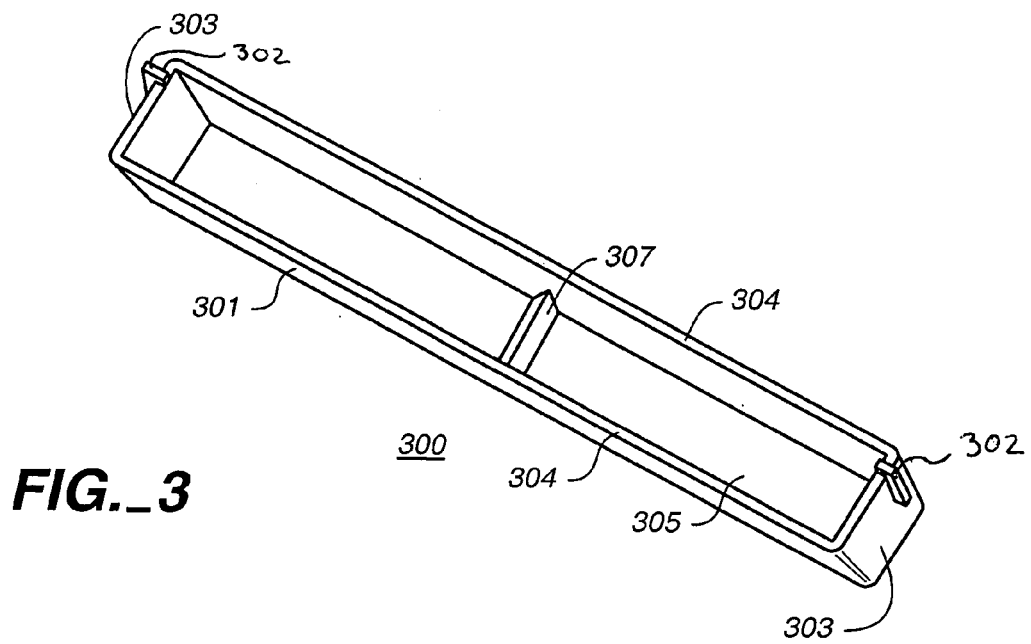
FIG._3

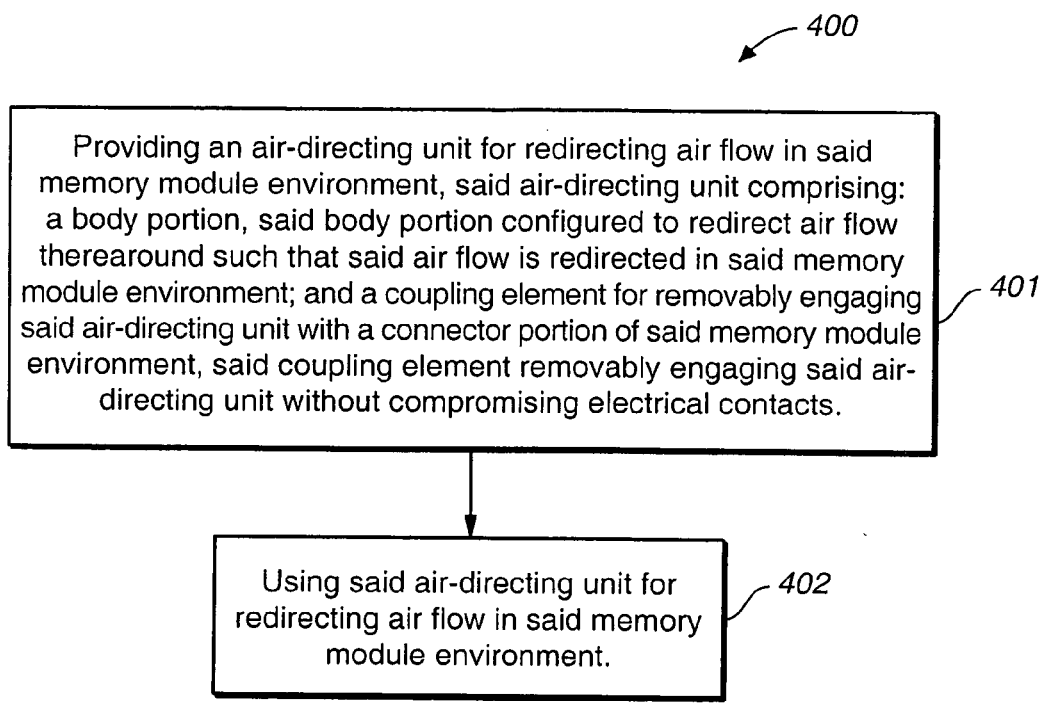
FIG._4

AIR-DIRECTING UNIT

TECHNICAL FIELD

The present invention pertains to an air-directing unit for redirecting air flow in a memory module environment of a computer.

BACKGROUND ART

In the memory module environment of a computer, electro-mechanical connectors, referred to as "connectors", are used to accommodate memory modules and establish an electrical connection between the memory module and other computer system components. A memory module is a collection of memory chips e.g. DRAMs mounted on a single substrate or a small printed circuit board. As is illustrated schematically in FIG. 1, a connector 101 typically comprises a mating portion 102 into which the memory module 103 is removably insertable to establish the electrical connection. The portion of the connector wherein the electrical connection is made is referred to as the "contact".

A single memory module 103 when inserted in the connector 101 is referred to as a "single in-line memory module" ("SIMM"). A SIMM is a memory module with contacts only on one side; actual DRAMs may be only on one side of the memory module PC board or substrate. A DIMM (double in-line memory module) is a variation of a SIMM in that a DIMM is a single memory module but comprises two rows of contacts, one on each side of the memory module PC board or substrate; actual DRAMs are also on both sides of the board or substrate. A single SIMM is installed into a single SIMM connector and a single DIMM is installed into a single DIMM connector.

To allow for incrementally increasing the amount of available memory to the computer, redundant connectors are provided to receive addition memory modules in the memory module environment.

In use, installed memory modules generate heat that must be dissipated. One way to dissipate the heat is to blow cooling air around and between the installed modules. However, if the installed modules are crowded together and/or if they are located in inaccessible areas in the memory environment, the cooling air will tend to take a path of least resistance and pass over the unoccupied space, instead of passing by the installed memory modules. Consequently, the installed memory modules are not effectively cooled.

In the prior art, one attempt to address the problem of air by-passing installed memory modules has been to install dummy memory modules in unoccupied connectors to eliminate paths of least resistance in the memory module environment. A sheet of plastic shaped like a SIMM or DIMM can also be used for this purpose. A problem with this solution is that since the dummy module or the plastic sheet, when inserted in the connector, rubs the contacts, the contacts prematurely wear and/or accumulate debris and film, causing degradation of the electrical connection between the subsequently installed memory modules and the connector.

Another prior art attempt to address the problem of air by-passing installed memory modules has been to install sheet metal in strategic areas of the memory module environment to control air flow. However, this solution is not always feasible due to lack of available space in the memory module environment to accommodate the sheet metal. Besides, this solution tends to be relatively expensive as the sheet metal has to be customized for each environment.

Yet another attempt to address the problem of air by-passing the installed memory modules has been to install the memory modules evenly throughout the available space in the memory module environment so as to eliminate paths of least resistance to air flow. However, this solution also is not always feasible if the design requires that the modules are clustered together.

Accordingly, there is a need for a better solution to ensure that cooling air is effectively directed around installed memory modules in a memory environment without compromising the electrical contacts in the connectors. There is also a need for a solution that is relatively inexpensive and suitable for use in industry-standard connectors. Embodiments of the present invention provide a novel solution to these needs.

DISCLOSURE OF THE INVENTION

The present invention is an air-directing unit for use in redirecting air flow in a memory module environment of a computer. The air-directing unit comprises a body portion configured to redirect air flow therearound such that the air flow is redirected in the memory module environment. Additionally, the air-directing unit includes a coupling element for removably engaging the air-directing unit with a connector portion of the memory module environment, the coupling element removably engaging the air-directing unit without compromising electrical contacts in the connector.

BRIEF DESCRIPTION OF THE DRAWINGS

The following Figures which are incorporated in and form a part of this specification illustrate embodiments of the invention. Together with the description, they serve to explain the principles of the invention.

FIG. 1 is a schematic view of a connector with an installed memory module.

FIG. 2 is a top perspective view of an air-directing unit in accordance with an embodiment of the present invention.

FIG. 3 is a bottom perspective view of an air-directing unit in accordance with an embodiment of the present invention.

FIG. 4 is a method of redirecting air flow in a memory module environment using an embodiment of the present invention.

The drawings referred to in this description should not be understood as being drawn to scale except if specifically noted.

BEST MODE FOR CARRYING OUT THE INVENTION

Reference is now made in detail to embodiments of the present invention, examples of which are illustrated in the accompanying Figures. While the invention is described in conjunction with these embodiments, it is to be understood that the invention is not limited to these embodiments. On the contrary, the invention is intended to cover alternatives, modifications and equivalents which are included within the spirit and scope of the invention as defined by the appended claims. Furthermore, in the following description of the invention, numerous specific details are set forth in order to provide a thorough understanding of the present invention. However, it will be understood by those of ordinary skill in the art that the present invention may be practiced without these specific details. In other instances, it will be understood that it is not necessary to describe in detail, well-known methods, procedures, components, and circuits to avoid unnecessarily obscuring aspects of the present invention.

The embodiments of the present invention are well suited for use with connectors in a microcomputer memory module environment. The embodiments of the present invention, however, are not limited to use in microcomputers but it is contemplated that they may also be used in other computers that utilize in-line memory modules in a memory module environment. Similarly, although the following discussion and examples sometimes deal specifically with either a SIMM or a DIMM memory module, it will be appreciated that embodiments of the present invention are useable with both types of memory modules and their equivalents.

In overview, embodiments of the present invention help redirect air flow in a memory module environment of a computer without compromising the electrical contacts in the connector. When installed over unoccupied connectors in the memory module environment, the air-directing unit eliminates space and thus eliminates paths of least resistance to air flow in the memory module environment. Consequently, air by-pass in the memory module environment is minimized.

The following is a description of the physical structure of the air-directing unit of the invention, followed by a description of the use of the air-directing unit in conjunction with a connector in a memory module environment.

Referring to FIG. 2, which depicts a top perspective view of an embodiment of the invention, the air-directing unit 200 of the invention comprises a body portion 201 and coupling elements 202.

Body portion 201 is a generally oblong-shaped unit defined by opposed end-walls 203, opposed side-walls 204 and a top-wall 205. In one embodiment, end-walls 203, side-walls 204 and top-wall 205 define a hollow body portion 201, while in another embodiment end-walls 203, side-walls 204 and top-wall 205 define a solid body portion 201. Body portion 201 is dimensioned to allow for an air-directing unit 200 to removably fit over an unoccupied connector 101 in a memory module environment, without touching adjacent connectors or without touching electrical contacts on the connector, to redirect air flow. In one embodiment, body portion 201 is dimensioned to fit over industry-standard connectors.

In the embodiment wherein end-walls 203, side-walls 204 and top-wall 205 define a hollow body portion 201, the walls can be fabricated from a wide variety of materials e.g. injection molded plastics, ceramics, sheet metal and their equivalents, by well known methods. In the present embodiment, the walls should be made sufficiently thick to allow for handling and installing the unit in a memory module environment.

In the embodiment wherein end-walls 203, side-walls 204 and top-wall 205 define a solid body portion 201, the air-directing unit 200 can also be fabricated from a wide variety of suitable materials e.g. plastics, metals, ceramics and their equivalents, provided however that the material can be formed, for example by machining, into body portion 201, taking into consideration such factors as the strength of the material, the cost and the ease with which the material can be formed into body portion 201.

Opposed end-walls 203 are generally rectangular-shaped, spaced-apart left and right end-wall portions. Similarly, opposed side-walls 204 are generally rectangular-shaped, spaced-apart front and back side-wall portions disposed in planes substantially perpendicular to end-walls 203. Top-wall 205 is a generally rectangular-shaped top-wall portion having a width corresponding to the width of end-walls 203, and a length corresponding to the length of side-walls 204. Top-wall 205 connects end-walls 203 and side-walls 204 to define body portion 201.

Top-wall 205 includes gripping areas 206 for aid in installing the air-directing unit 200 in the connector (not shown) in a memory module environment (not shown).

Continuing with reference to FIG. 2, coupling elements 202 are generally rectangular-shaped portions connected to and projecting outwards from end-walls 203 in a plane substantially perpendicular to end-walls 203. Coupling elements 202 can be fixedly attached to body portion 201 or removably attached to body portion 201. Coupling elements 202 are comprised of the same material as body portion 201, i.e. injected molded plastic, sheet metal, metals, ceramics, etc. as the case may be, or their equivalents. In use, each coupling element 202 mates with a cavity (not shown) on each end of the connector 101 for securing air-directing unit 200 over an unoccupied connector in the memory module environment without touching the electrical contacts in the connector. Since coupling element 202 is designed to mate with a cavity in the connector, the shape of coupling unit 202 can vary, depending on the shape of the corresponding mating portion in the connector.

Referring to FIG. 3 which depicts a bottom perspective view of the embodiment of the air-directing unit 200 depicted in FIG. 2, air-directing unit 300 comprises body portion 301 defined by end-walls 303, opposed side-walls 304 and a top-wall 305. Air-directing unit 300 includes coupling elements 302 connected to end-walls 303 and projecting outwards therefrom, and a cross member 307 connecting top-wall 305 and side-walls 304.

The air-directing unit of the present invention can be used to redirect air flow in a memory module environment in accordance with the method 400 shown generally in FIG. 4. In step 401, an air-directing unit 105, 106 comprising body portion 201, 301 as described above is obtained for use in the memory module environment.

In step 402, the air-directing unit of the invention (105, 106) is used in a memory module environment as follows. Referring to FIG. 4 in conjunction with FIGS. 1 and 2, the air-directing unit (105, 106) can be removably inserted into connector 101 by grasping the unit and pushing down on grip-areas 206 of top wall 205 in the same manners as one would install an in-line memory in the connector. However, unlike the case with inserting an in-line memory module, the insertion of the air-directing unit of the present invention will engage with cavities (not shown) in the ends of the connector 101 through coupling elements 202. Thus the insertion of the air-directing unit of the present invention will not engage with the mating portion 102 (which establishes electrical contact in the connector).

Simultaneously as coupling elements 202 engages the cavities (not shown) in the ends of the connector 101, built-in securing elements (not shown) in the ends of the connector 101 will rotate in one direction to engage coupling elements 202 thereby securing air-directing unit 200 over the connector 101. Rotating the built-in securing elements (not shown) in the opposite direction will disengage and release the air-directing unit 200 from the connector 101.

The connector portion 101 comprises an ejector element for removably securing air-directing unit 200 with the memory module environment. The ejector element can also be for removably ejecting air-directing unit 200 from the memory module environment.

Embodiments of the present invention and how it is used to redirect air flow in a memory module environment are thus described. As will be appreciated, an advantage of the presently claimed invention is that since the air-directing unit does not come in contact with the electrical contact point in the connector, it avoids the prior art problem of premature wear of the contacts, and/or accumulation of debris and film that may degrade the electrical connection, while effectively redirecting air flow in a memory module environment. Also as should also be apparent from the above description, advantageously, the present air-direction unit can be dimensioned for used in industry-standard connectors and therefore its use would not require modification of the connector. Further, since the units can be made from readily available materials such as injection molded plastic, they can be produced more economically for widespread use.

While the present invention has been described in particular embodiments, it should be appreciated that the present invention should not be construed as limited by such embodiments, but rather construed according to the following claims.

What is claimed is:

1. An air-directing unit for redirecting air flow in a memory module environment, said air-directing unit comprising:
   a body portion, said body portion configured to redirect air flow therearound such that said air flow is redirected in said memory module environment; and
   a coupling element for removably engaging said air-directing unit with a connector portion of said memory module environment, said coupling element removably engaging said air-directing unit without compromising electrical contacts, wherein said coupling element is removably attached to said body portion.

2. The air-directing unit of claim 1, wherein said connector portion for receiving a double in-line memory module.

3. The air-directing unit of claim 1, wherein said memory module environment is a microcomputer memory environment.

4. The air-directing unit of claim 1, wherein said body portion comprises a generally oblong solid body portion.

5. The air-directing unit of claim 1, wherein said body portion comprises a gripping portion for engaging said air-directing unit with said connector portion.

6. The air-directing unit of claim 1, wherein said body portion comprises injection molded material.

7. The air-directing unit of claim 6, wherein said injection molded material comprises injection molded plastic.

8. The air-directing unit of claim 1, wherein said body portion comprises sheet metal material.

9. The air-directing unit of claim 1, wherein said body portion comprises a generally oblong hollow body portion.

10. The air-directing unit of claim 1, wherein said coupling element comprises a generally rectangular portion.

11. The air-directing unit of claim 1, wherein said coupling element comprises injection molded material.

12. The air-directing unit of claim 1, wherein said coupling element comprises sheet metal material.

13. The air-directing unit of claim 1, wherein said connector portion defines a recessed cavity for removably coupling said coupling element with said memory module environment.

14. The air-directing unit of claim 13, wherein said recessed cavity is electrically isolated from said electrical contacts.

15. The air-directing unit of claim 1, wherein said connector portion comprises an ejector element for removably securing said air-directing unit with said memory module environment.

16. The air-directing unit of claim 1, wherein said connector portion comprises an ejector element for removably ejecting said air-directing unit from said memory module environment.

17. The air-directing unit of claim 1, wherein said connector portion for receiving a single in-line memory module.

18. The air-directing unit of claim 1, wherein said connector portion comprises said electrical contacts.

19. A method of cooling in-line memory modules in a memory module environment, the method comprising:
   providing an air-directing unit for redirecting air flow in said memory module environment, said air-directing unit comprising:
      a body portion, said body portion configured to redirect air flow therearound such that said air flow is redirected in said memory module environment; and
      a coupling element for removably engaging said air-directing unit with a connector portion of said memory module environment, said coupling element removably engaging said air-directing unit without compromising electrical contacts, wherein said connector portion comprises an ejector element for removably securing said air-directing unit with said memory module environment.

20. The method of claim 19, wherein said connector portion for receiving a single in-line memory module.

21. The method of claim 19, wherein said connector portion for receiving a double in-line memory module.

22. The method of claim 19, wherein said memory module environment is a microcomputer memory environment.

23. The method of claim 19, wherein said body portion comprises a generally oblong solid body portion.

24. The method of claim 19, wherein said body portion comprises a generally oblong hollow body portion.

25. The method of claim 19, wherein said body portion comprises injection molded material.

26. The method of claim 25, wherein said injection molded material comprises injection molded plastic.

27. The method of claim 19, wherein said body portion comprises sheet metal material.

28. The method of claim 19, wherein said coupling element is fixedly attached to said body portion.

29. The method of claim 19, wherein said coupling element is removably attached to said body portion.

30. The method of claim 19, wherein said coupling element comprises a generally rectangular portion.

31. The method of claim 19, wherein said coupling element comprises injection molded material.

32. The method of claim 19, wherein said coupling element comprises sheet metal material.

33. The method of claim 19, wherein said connector portion defines a recessed cavity for removably coupling said coupling element with said memory module environment.

34. The method of claim 33, wherein said recessed cavity is electrically isolated from said electrical contacts.

35. The method of claim 19, wherein said ejector element for removably ejecting said air-directing unit from said memory module environment.

36. The method of claim 19, wherein said connector portion comprises said electrical contacts.

* * * * *